United States Patent
Zhao et al.

(10) Patent No.: US 12,142,480 B2
(45) Date of Patent: Nov. 12, 2024

(54) SEAM REMOVAL IN HIGH ASPECT RATIO GAP-FILL

(71) Applicant: Applied Materials, Inc., Santa Clara, CA (US)

(72) Inventors: Qinghua Zhao, Sunnyvale, CA (US); Rui Cheng, San Jose, CA (US); Ruiyun Huang, Santa Clara, CA (US); Dong Hyung Lee, Danville, CA (US); Aykut Aydin, Sunnyvale, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 410 days.

(21) Appl. No.: 17/401,574

(22) Filed: Aug. 13, 2021

(65) Prior Publication Data
US 2023/0050255 A1    Feb. 16, 2023

(51) Int. Cl.
*H01L 21/02* (2006.01)
*H01L 21/3205* (2006.01)

(52) U.S. Cl.
CPC .... *H01L 21/0234* (2013.01); *H01L 21/02167* (2013.01); *H01L 21/0217* (2013.01); *H01L 21/32055* (2013.01)

(58) Field of Classification Search
CPC ........... H01L 21/0234; H01L 21/02167; H01L 21/0217; H01L 21/3205; H01L 21/32055
See application file for complete search history.

(56) References Cited

U.S. PATENT DOCUMENTS

| | | | |
|---|---|---|---|
| 2014/0051263 A1* | 2/2014 | Tanaka | C23C 16/345 438/778 |
| 2015/0262838 A1 | 9/2015 | Sugino et al. | |
| 2016/0020094 A1 | 1/2016 | Van Aerde et al. | |
| 2019/0385898 A1 | 12/2019 | Peng | |

(Continued)

FOREIGN PATENT DOCUMENTS

JP    2006024815 A    1/2006

OTHER PUBLICATIONS

International Search Report and Written Opinion mailed on Nov. 29, 2022 in International Patent Application No. PCT/US2022/039603, 10 pages.

*Primary Examiner* — Monica D Harrison
*Assistant Examiner* — Andre C Stevenson
(74) *Attorney, Agent, or Firm* — Kilpatrick Townsend & Stockton LLP

(57) ABSTRACT

Exemplary methods of semiconductor processing may include providing a silicon-containing precursor to a processing region of a semiconductor processing chamber. A substrate may be disposed within the processing region of the semiconductor processing chamber. The methods may include depositing a silicon-containing material on the substrate. The silicon-containing material may extend within the one or more recessed features along the substrate and a seam or void may be defined by the silicon-containing material within at least one of the one or more recessed features along the substrate. The methods may also include treating the silicon-containing material with a hydrogen-containing gas, such as plasma effluents of the hydrogen-containing gas, which may cause a size of the seam or void to be reduced.

11 Claims, 3 Drawing Sheets

(56) References Cited

U.S. PATENT DOCUMENTS

2021/0028055 A1    1/2021  Manna et al.
2021/0391171 A1*  12/2021  Yuan ................. C23C 16/45536
2022/0178028 A1*  6/2022  Xinjian ............. C23C 16/45553

* cited by examiner

SEAM REMOVAL IN HIGH ASPECT RATIO GAP-FILL

TECHNICAL FIELD

The present technology relates to methods and components for semiconductor processing. More specifically, the present technology relates to systems and methods for reducing the size of a seam or void in a silicon-containing material.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in seams or voids in the materials that may result in unwanted undesirable effects in further processing. Developing materials that can control seam or void formation may become more difficult.

Thus, there is a need for improved systems and methods that can be used to produce high quality devices and structures. These and other needs are addressed by the present technology.

SUMMARY

Exemplary methods of semiconductor processing may include providing a silicon-containing precursor to a processing region of a semiconductor processing chamber. A substrate may be disposed within the processing region of the semiconductor processing chamber. The methods may include depositing a silicon-containing material on the substrate. The silicon-containing material may extend within the one or more recessed features along the substrate and a seam or void may be defined by the silicon-containing material within at least one of the one or more recessed features along the substrate. The methods may also include treating the silicon-containing material with a hydrogen-containing gas, such as plasma effluents of the hydrogen-containing gas, which may cause a size of the seam or void to be reduced.

In some embodiments, the silicon-containing material may include at least one of amorphous silicon, doped silicon, silicon nitride, or silicon carbide. The seam or void may include an aspect ratio of greater than or about 10:1. A temperature within the semiconductor processing chamber may be maintained at greater than or about 100° C. while treating the silicon-containing material on the substrate with the plasma effluents of the hydrogen-containing gas. A pressure within the semiconductor processing chamber may be maintained at less than or about 20 Torr while treating the silicon-containing material on the substrate with the plasma effluents of the hydrogen-containing gas. The methods may also include providing a source of electric power when forming the plasma of the hydrogen-containing gas within the processing region of the semiconductor processing chamber. For example, the plasma may be generated at a plasma power of less than or about 2,000 W. The methods may include providing the hydrogen-containing gas to the processing region of the semiconductor processing chamber at a rate of greater than or about 250 sccm. Treating the silicon-containing material on the substrate with the plasma effluents of the hydrogen-containing gas may be performed at a temperature within 25° C. of the temperature at which the silicon-containing material is formed on the substrate. The methods may include adjusting a pressure within the semiconductor processing chamber prior to treating the silicon-containing material on the substrate with the plasma effluents of the hydrogen-containing gas. Adjusting the pressure may include increasing the pressure within the semiconductor processing chamber prior to treating the silicon-containing material on the substrate with the plasma effluents of the hydrogen-containing gas. The plasma effluents may expand the silicon-containing material, which may cause a size of the seam or void at or near an upper surface of the silicon-containing material to be reduced.

Some embodiments of the present technology may encompass semiconductor processing methods. The methods may include providing a silicon-containing precursor to a processing region of a semiconductor processing chamber. A substrate may be disposed within the processing region of the semiconductor processing chamber. The methods may include depositing a silicon-containing material on the substrate. The silicon-containing material may extend within the one or more recessed features along the substrate. A seam or void may be defined by the silicon-containing material within at least one of the one or more recessed features along the substrate. The methods may include treating the silicon-containing material with a hydrogen-containing gas. The hydrogen-containing gas may cause a size of the seam or void to be reduced.

In some embodiments, a temperature within the semiconductor processing chamber may be maintained at less than or about 600° C. while treating the silicon-containing material on the substrate with the hydrogen-containing gas. A pressure within the semiconductor processing chamber may be maintained at greater than or about 0.2 Torr while treating the silicon-containing material on the substrate with the hydrogen-containing gas. Treating the silicon-containing material on the substrate with the hydrogen-containing gas may be performed at a temperature within 25° C. of the temperature at which the silicon-containing material is formed on the substrate. The methods may further include adjusting a pressure within the semiconductor processing chamber prior to treating the silicon-containing material on the substrate with plasma effluents of the hydrogen-containing gas.

Some embodiments of the present technology may encompass semiconductor processing methods. The methods may include providing a silicon-containing precursor to a processing region of a semiconductor processing chamber. A substrate may be disposed within the processing region of the semiconductor processing chamber. The methods may include depositing a silicon-containing material on the substrate. The silicon-containing material may extend within the one or more recessed features along the substrate. A seam or void may be defined by the silicon-containing material within at least one of the one or more recessed features along the substrate. The methods may include treating the silicon-containing material with a hydrogen-containing gas. The hydrogen-containing gas may expand the silicon-containing material, which may cause a size of the seam or void at or near an upper surface of the silicon-containing material to be reduced.

In some embodiments, a temperature within the semiconductor processing chamber may be maintained at greater than or about 100° C. to less than or about 600° C. while treating the silicon-containing material on the substrate with the hydrogen-containing gas. A pressure within the semiconductor processing chamber may be maintained at greater than or about 0.2 Torr to less than or about 300 Torr while treating the silicon-containing material on the substrate with the hydrogen-containing gas. The methods may include adjusting a pressure within the semiconductor processing chamber prior to treating the silicon-containing material on the substrate with the plasma effluents of the hydrogen-containing gas. The methods may include increasing a pressure within the semiconductor processing chamber prior to treating the silicon-containing material on the substrate with the plasma effluents of the hydrogen-containing gas.

Such technology may provide numerous benefits over conventional systems and techniques. For example, embodiments of the present technology may reduce the seam or void size applicable to a number of substrate features. Additionally, the present technology may produce silicon-containing films for post-deposition applications, as well as any other application for which a reduced seam or void size may be a benefit. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
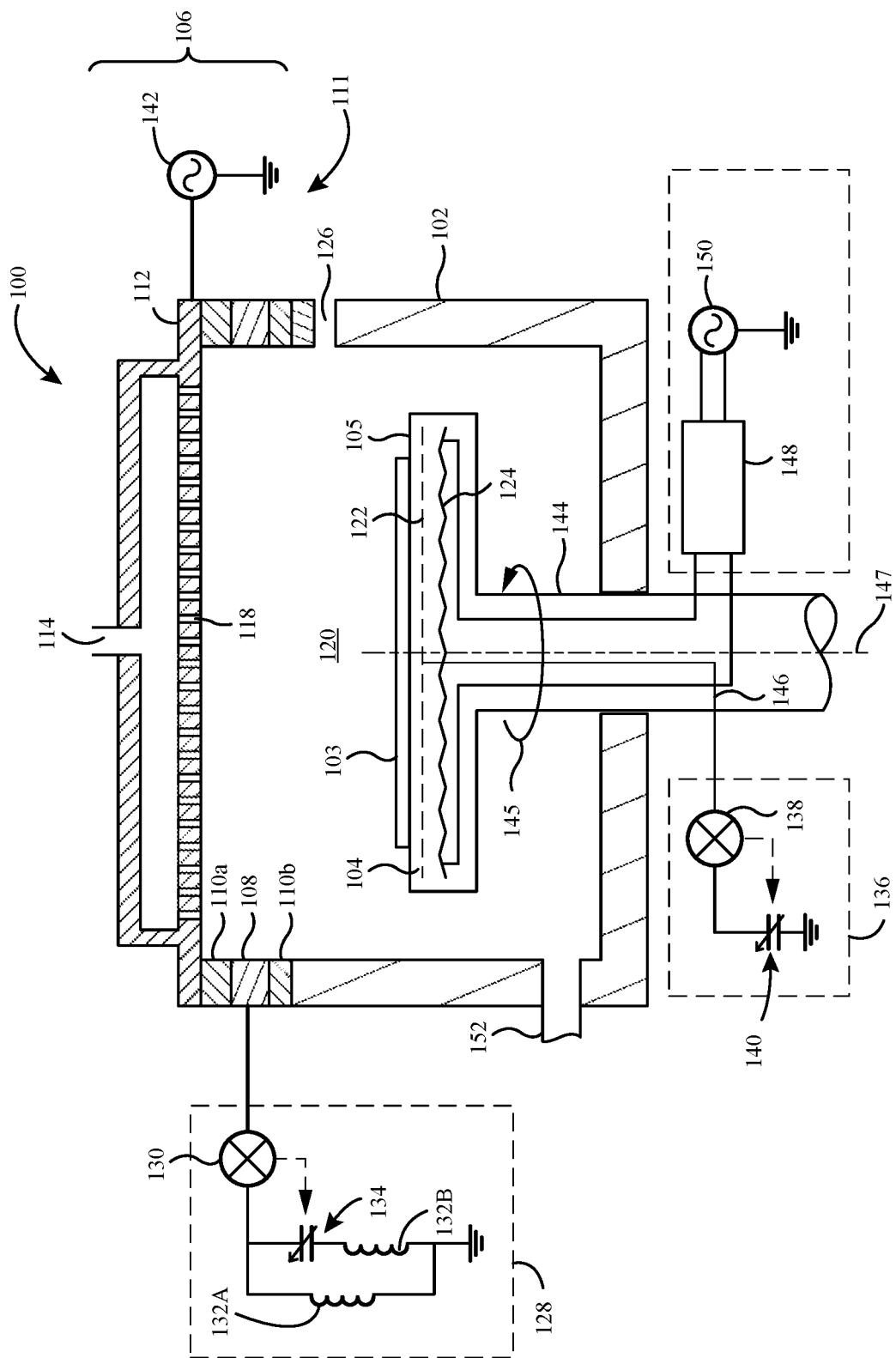
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features inside semiconductor structures may be reduced in size, and aspect ratios of the features may increase. As the aspect ratios of the features increase, chemical vapor deposition processes may produce seams or voids within the feature.

Conventional technologies have struggled to produce films to fill high aspect ratio features in the underlying structures where seam or void formation is controlled. Deposition of silicon-containing materials on the underlying structures containing the high aspect ratio trenches, may be incomplete. The conformal fill operation may allow the feature to seal near the top of the feature prior to fill within the feature, as well as to produce a seam up the middle of the feature, which can extend to the top of the structure. In some production, where a polishing operation may subsequently occur, the removal may cause the seam to be exposed, which may provide access within the feature. This may allow oxidation of the material once exposed to atmosphere, as well as incorporation of slurry or other materials along the seam. Accordingly, many conventional technologies have been limited in the ability to prevent structural flaws in the final devices.

The present technology overcomes these issues by treating a film on the underlying structure to reduce the size of any voids or seams in the film. By treating the film with a hydrogen-containing gas, the present technology may alter the film on the underlying structure to expand the film to effectively narrow the seams or voids or cause the seams or voids to seal or close off at or near an upper portion of the feature. By sealing the features or high aspect ratio structure, the present technology may prevent problems in any following integration processes and/or defects in the final devices. Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary semiconductor processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support 104 during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the semiconductor processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the semiconductor processing chamber 100. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with the surface 105 of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support 104. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support 104 may decline. The second electronic controller 140 may have a similar effect, increasing and decreasing aerial coverage of the plasma over the substrate support 104 as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
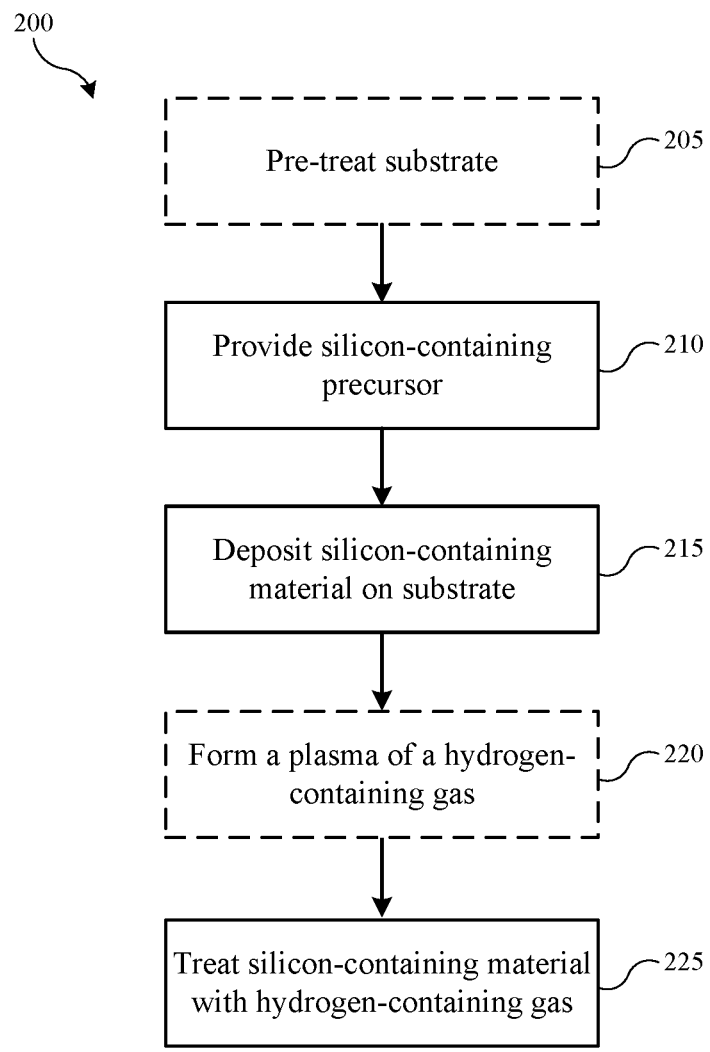
FIG. 2 shows operations in a semiconductor processing method according to some embodiments of the present technology.

As discussed previously, although a plasma-processing chamber may be used for one or more aspects of film processing, in some embodiments forming silicon-containing films may not utilize a plasma-enhanced process for some or all of the operations. The present technology may at least form film layers without plasma generation, in some embodiments. FIG. 2 shows exemplary operations in a processing method 200 according to some embodiments of the present technology. The method 200 may be performed in a variety of processing chambers, including the semiconductor processing chamber 100 described above, as well as any other chambers including non-plasma chambers, in which the operations may be performed. Method 200 may include one or more operations prior to the initiation of the method 200, including front-end processing, deposition, etching, polishing, cleaning, or any other operations that may be performed prior to the described operations. The methods 200 may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3B, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
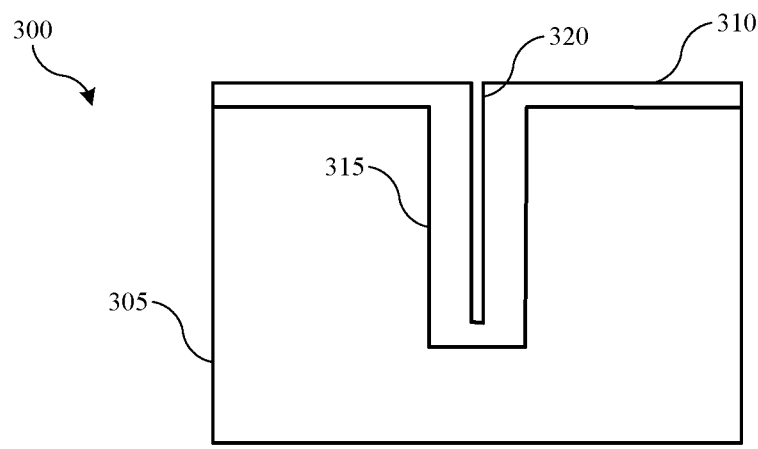
FIGS. 3A-3B show exemplary schematic cross-sectional structures in which material layers are included and produced according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structure 300 on which a silicon-containing material may be formed. As illustrated in FIG. 3A substrate 305 may be processed to form one or more recesses or features, such as trenches, apertures, or any other structure in semiconductor processing. Substrate 305 may be any number of materials, such as a base wafer or substrate 305 made of silicon or silicon-containing materials, other substrate 305 materials, as well as one or more materials that may be formed overlying the substrate 305 during semiconductor processing. For example, in some embodiments the substrate may be processed to include one or more materials or structures for semiconductor processing. Substrate 305 may be or include a dielectric material, such as an oxide or nitride of any number of materials, and features or recesses formed may provide access to one or more underlying materials. Although only one feature is shown in the figure, it is to be understood that exemplary structures may have any number of features defined along the structure according to embodiments of the present technology.

To increase silicon adhesion and nucleation, in some embodiments method 200 may include a pre-treatment at optional operation 205. By pre-treating the surface of the substrate 305, adhesion of the film may be improved by producing favorable terminations along the substrate 305 or material on which deposition may be performed. The pre-treatment may be or include a thermal process, or may include a plasma-enhanced process. The treatment may include delivery of a hydrogen-containing precursor, a nitrogen-containing precursor, or some other precursor, which may flow to contact or interact with exposed surfaces on the substrate 305. Exemplary precursors may include delivery of one or more of hydrogen, nitrogen, ammonia, or other hydrogen-containing or nitrogen-containing precursors, among other materials that may pre-treat the substrate 305. The precursor or precursors may be delivered to the processing region of the chamber, and a plasma may be formed. The substrate 305 may be contacted with plasma effluents of the precursors, and favorable terminations may be produced. Many materials may additionally include a superficial oxidation layer due to atmospheric exposure at some point during processing. By performing a pre-treatment, hydroxyl terminations may be removed or replaced with more favorable nitrogen-containing or hydrogen-containing terminations.

At operation 210, the method 200 may include providing a silicon-containing precursor to the processing region of a semiconductor processing chamber 100 where the substrate 305 may be housed. The semiconductor processing chamber 100 may be the same or a different chamber from the chamber in which a pre-treatment may be performed. The silicon-containing precursor may be flowed into the processing region to contact the substrate 305, as well as treated surfaces when they are produced. A layer of silicon-containing material 310, which may be silicon, including amorphous silicon, doped silicon, silicon nitride, or silicon carbide, may be formed or deposited along the substrate 305 at operation 215. As illustrated in FIG. 3A, the silicon-containing layer 310 may extend along any and/or all exposed surfaces along the substrate 305, when exposed, as well as any other incorporated materials. As also shown, one or more features 315 may be defined by substrate 305, such as a trench, aperture, or other recessed feature. The aspect ratio of the features, or the ratio of the depth of the feature relative to the width or diameter of the feature formed, may be greater than or about 2:1, and may be greater than or about 3:1, greater than or about 4:1, greater than or about 5:1, greater than or about 6:1, greater than or about 7:1, greater than or about 8:1, greater than or about 9:1, greater than or about 10:1, or more. The deposition may be conformal, and thus, growth may occur inward within the feature from the walls defining the feature. The process may be performed for a period of time sufficient to produce an amount of coverage to fill the feature. As the feature closes, a seam 320, which may be a void as illustrated a distance within the feature, may be formed. The seam 320 may extend the distance of the feature to an exposed upper surface as illustrated. Although illustrated as a consistent opening in the figure, it is to be understood that seam/void structure may be characterized by a number of shapes, which may include top-wide, bottom wide, as well as a more amorphous shape, as would be readily understood by the skilled artisan.

Subsequent to depositing the silicon-containing material 310, a hydrogen-containing gas may be provided to the processing region of the semiconductor processing chamber 100 to treat the silicon-containing material. The hydrogen treatment may be performed in a number of ways, which may include both a thermal treatment, as well as a plasma-enhanced treatment. When a plasma-enhanced treatment is performed, a plasma may be generated from the hydrogen-containing gas in the processing region at optional operation 220. While thermal operations may still ensure seam sealing at locations within the structure, a plasma-enhanced treatment may allow thermal budgets to be protected, while also increasing the penetration of hydrogen within the feature, which may improve the depth at which the seam may be sealed.

Figure 3B:
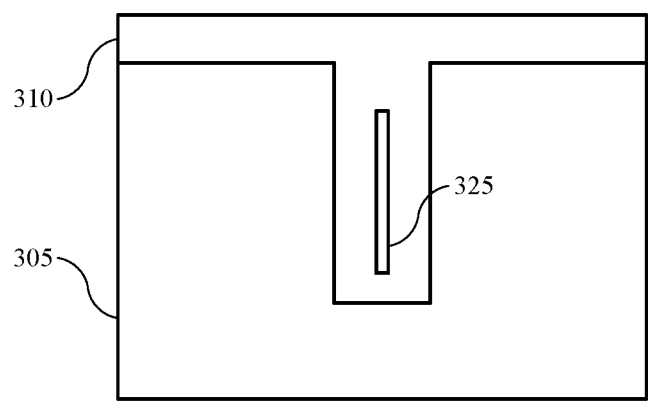

Whether thermal or plasma-enhanced, at operation 225, the silicon-containing material and the hydrogen-containing gas or plasma effluents may be reacted within the processing region of the semiconductor processing chamber 100, which may alter the silicon-containing layer 310 on the substrate 305. As illustrated in FIG. 3B, the silicon-containing material 310 on the substrate 305 may be hydrogenated and expand to an increased volume and decreased density when treated with the hydrogen-containing gas. The hydrogen may be incorporated within the structure, which may allow the seam to be at least partially sealed about the mouth of the feature. For example, and without being bound to any particular theory, the seam may be formed at least in part from terminated surfaces growing from either side of the feature. The hydrogen may increase bond breaking and restructuring, which may allow silicon and hydrogen chains to form across the regions, and allow the seam to be sealed. This may cause a size of the seam or void 320 to be reduced as shown, which may ensure that the seam is not exposed in subsequent processing. Although a portion of the seam or void 325 may remain after treatment with the hydrogen-containing gas in some embodiments of the present technology, the seam or void 325 may be substantially reduced or fully closed at or near an upper surface of the silicon-containing material 310. For example, from an entrance of the feature, the seam may be fully resolved or sealed to a depth of greater than or about 1% of the depth of the feature, and may be sealed to a depth of greater than or about 5% of the depth of the feature, greater than or about 10% of the depth of the feature, greater than or about 20% of the depth of the feature, greater than or about 30% of the depth of the feature, greater than or about 40% of the depth of the feature, greater than or about 50% of the depth of the feature, or more.

In some embodiments in which the treatment is plasma enhanced, a plasma power may impact the depth of hydrogen penetration, the extent of bond reorientation, and the amount of seam sealing that may occur. Accordingly, in some embodiments the plasma power may be greater than or about 50 W, and may be greater than or about 100 W, greater than or about 200 W, greater than or about 300 W, greater than or about 400 W, greater than or about 500 W, greater than or about 600 W, greater than or about 700 W, greater than or about 800 W, greater than or about 900 W, greater than or about 1000 W, greater than or about 1250 W, greater than or about 1500 W, greater than or about 1750 W, greater than or about 2000 W, or more. However, at higher plasma power the bombardment may cause sputtering or etching of the film, and thus in some embodiments the plasma power may be less than or about 1500 W, less than or about 1250 W, less than or about 1000 W, or less.

During any operation of the method, the semiconductor processing chamber 100, the pedestal, or the substrate 305 may be maintained at a variety of temperatures at which film deposition may be performed. In some embodiments, the temperature during the deposition of the silicon-containing material 310 on the substrate 305 and the treatment of the silicon-containing material 310 with the hydrogen-containing gas may be performed at nearly the same temperature, and in some embodiments a temperature may be maintained at a temperature that is greater than or about 100° C., greater than or about 150° C., greater than or about 200° C., greater than or about 250° C., greater than or about 300° C., greater than or about 350° C., greater than or about 400° C., greater than or about 450° C., greater than or about 500° C., greater than or about 550° C., greater than or about 600° C., or higher. Increased substrate or processing temperatures may lead to outgassing of hydrogen being incorporated within the film, and thus in some embodiments the temperature may be maintained at less than or about 500° C., less than or about 450° C., or less. In some embodiments, treating the silicon-containing material 310 on the substrate 305 with the hydrogen-containing gas, such as the plasma effluents of the hydrogen-containing gas, may be performed at a temperature within 25° C. of the temperature at which the silicon-containing material 310 is formed on the substrate 305.

At operation 220, the semiconductor processing chamber 100 may be maintained at a variety of pressures at which film deposition may be performed. Additionally, in some embodiments the pressure may be adjusted subsequent film deposition, such as during the hydrogen treatment. For example, film deposition may occur at pressures greater than or about 0.5 Torr, greater than or about 1 Torr, greater than or about 3 Torr, greater than or about 5 Torr, greater than or about 10 Torr, greater than or about 12 Torr, or greater. Depending on the properties of the silicon-containing material 310 being treated with the hydrogen-containing gas, the pressure may be adjusted within the semiconductor processing chamber 100 prior to or while treating the material with the hydrogen-containing gas. For example, depending on the strength of the film, such as the hardness or Young's modulus of the film, increasing the pressure during the hydrogen treatment may ensure adequate modification of a harder material, whereas lowering the pressure during the hydrogen treatment may limit sputtering or damage to a softer material. Hence, for example, when the silicon-containing material is silicon carbide or silicon nitride, a pressure may be increased between deposition and hydrogen treatment. Additionally, when the silicon-containing material is amorphous silicon, the pressure may be maintained or reduced from the deposition pressure. In some embodiments, regardless of the material, a pressure may be increased which may increase an amount of hydrogen atoms within the processing volume, and may increase interaction with the silicon-containing material. Accordingly, in some embodiments a pressure during the hydrogen treatment may be maintained at a pressure that is greater than or about 1 Torr, greater than or about 5 Torr, greater than or about 10 Torr, greater than or about 20 Torr, greater than or about 50 Torr, greater than or about 100 Torr, greater than or about 200 Torr, or higher. Similarly, in some embodiments a pressure may be maintained at a pressure that is less than or about 200 Torr, less than or about 100 Torr, less than or about 50 Torr, less than or about 20 Torr, less than or about 10 Torr, less than or about 5 Torr, less than or about 1 Torr, or lower.

The flow rate of hydrogen-containing gas into the processing region of the semiconductor processing chamber 100 may be related the processing conditions, where a higher flow rate may be used with a higher pressure treatment, or where plasma power may be increased. For example, in some embodiments, the hydrogen-containing gas may be provided to the processing region of the semiconductor processing chamber 100 at a rate of greater than or about 250 sccm, and may be provided at a rate of greater than or about 500 sccm, greater than or about 750 sccm, greater than or about 1,000 sccm, or higher. By controlling the flow rate, pressure, and plasma power ratio, improved seam resolution may be performed. For example, for treatments performed at lower pressure, a lower plasma power and/or lower flow rate may be used to control the expansion of the silicon-containing film. Similarly, for treatments performed at a higher pressure, plasma power may also be increased, along with hydrogen flow rate, which may ensure sufficient interaction and penetration within the film. By performing hydrogen treatments according to embodiments of the present technology, chemical vapor deposition seam formation may be reduced or limited.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a silicon-containing precursor to a processing region of a semiconductor processing chamber, wherein a substrate is disposed within the processing region of the semiconductor processing chamber, and wherein the substrate defines one or more recessed features along the substrate;
depositing a silicon-containing material on the substrate, wherein the silicon-containing material extends within the one or more recessed features along the substrate, and wherein a seam or void is defined by the silicon-containing material within at least one of the one or more recessed features along the substrate;
forming a plasma of a hydrogen-containing gas within the processing region of the semiconductor processing chamber; and
treating the silicon-containing material with plasma effluents of the hydrogen-containing gas, wherein the plasma effluents cause a size of the seam or void to be reduced.

2. The semiconductor processing method of claim 1, wherein the silicon-containing material comprises at least one of amorphous silicon, doped silicon, silicon nitride, or silicon carbide.

3. The semiconductor processing method of claim 1, wherein the seam or void comprises an aspect ratio of greater than or about 10:1.

4. The semiconductor processing method of claim 1, wherein a temperature within the semiconductor processing chamber is maintained at greater than or about 100° C. while treating the silicon-containing material on the substrate with the plasma effluents of the hydrogen-containing gas.

5. The semiconductor processing method of claim 1, wherein a pressure within the semiconductor processing chamber is maintained at less than or about 20 Torr while treating the silicon-containing material on the substrate with the plasma effluents of the hydrogen-containing gas.

6. The semiconductor processing method of claim 1, further comprising providing a source of electric power when forming the plasma of the hydrogen-containing gas within the processing region of the semiconductor processing chamber, wherein the plasma is generated at a plasma power of less than or about 2,000 W.

7. The semiconductor processing method of claim 1, further comprising providing the hydrogen-containing gas to the processing region of the semiconductor processing chamber at a rate of greater than or about 250 sccm.

8. The semiconductor processing method of claim 1, wherein treating the silicon-containing material on the substrate with the plasma effluents of the hydrogen-containing gas is performed at a temperature within 25° C. of the temperature at which the silicon-containing material is formed on the substrate.

9. The semiconductor processing method of claim 1, further comprising adjusting a pressure within the semiconductor processing chamber prior to treating the silicon-containing material on the substrate with the plasma effluents of the hydrogen-containing gas.

10. The semiconductor processing method of claim 9, wherein adjusting the pressure comprises increasing the pressure within the semiconductor processing chamber prior to treating the silicon-containing material on the substrate with the plasma effluents of the hydrogen-containing gas.

11. The semiconductor processing method of claim 1, wherein the plasma effluents expand the silicon-containing material causing a size of the seam or void at or near an upper surface of the silicon-containing material to be reduced.

\* \* \* \* \*